US012597915B2

(12) United States Patent
Ilie et al.

(10) Patent No.: US 12,597,915 B2
(45) Date of Patent: Apr. 7, 2026

(54) CAPACITANCE CIRCUIT

(71) Applicant: Infineon Technologies AG, Neubiberg (DE)

(72) Inventors: Ionut-Alin Ilie, Bucharest (RO); Cristian Stefan Zegheru, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 117 days.

(21) Appl. No.: 18/605,449

(22) Filed: Mar. 14, 2024

(65) Prior Publication Data

US 2024/0339995 A1 Oct. 10, 2024

(30) Foreign Application Priority Data

Apr. 6, 2023 (DE) .......................... 102023108921.8

(51) Int. Cl.
H03K 5/02 (2006.01)
H03K 17/687 (2006.01)

(52) U.S. Cl.
CPC ........... H03K 5/02 (2013.01); H03K 17/6871 (2013.01)

(58) Field of Classification Search
CPC ..... H03K 5/02; H03K 17/6871; H03H 11/481
See application file for complete search history.

(56) References Cited

U.S. PATENT DOCUMENTS

2002/0121591 A1* 9/2002 Wada ....................... G06G 7/28
250/214.1
2019/0028075 A1* 1/2019 Kamezawa ......... H03F 3/45188

FOREIGN PATENT DOCUMENTS

CN 104049665 B * 9/2015
CN 111342778 B 2/2024

OTHER PUBLICATIONS

Office Action from counterpart German Application No. 102023108921.8 dated Mar. 25, 2024, 4 pp.

* cited by examiner

*Primary Examiner* — Metasebia T Retebo
(74) *Attorney, Agent, or Firm* — Shumaker & Sieffert, P.A.

(57) ABSTRACT

The present disclosure provides a capacitance circuit which has an input terminal and is configured to provide an increased capacitance between the input terminal and a first reference voltage. The capacitance circuit comprises a current source structure configured to provide a compensation current at the input terminal, a first transistor having a first control terminal and a first load current and being coupled to the input terminal, a second transistor having a second control terminal, a capacitance amplification circuit configured to provide a capacitance amplification factor and being coupled between the first control terminal and the second control terminal, and a capacitor having a core capacitance and being coupled between the first control terminal and the input terminal, wherein the compensation current corresponds to the first load current during direct current operation, and wherein the increased capacitance is based on the core capacitance and the capacitance amplification factor.

8 Claims, 7 Drawing Sheets

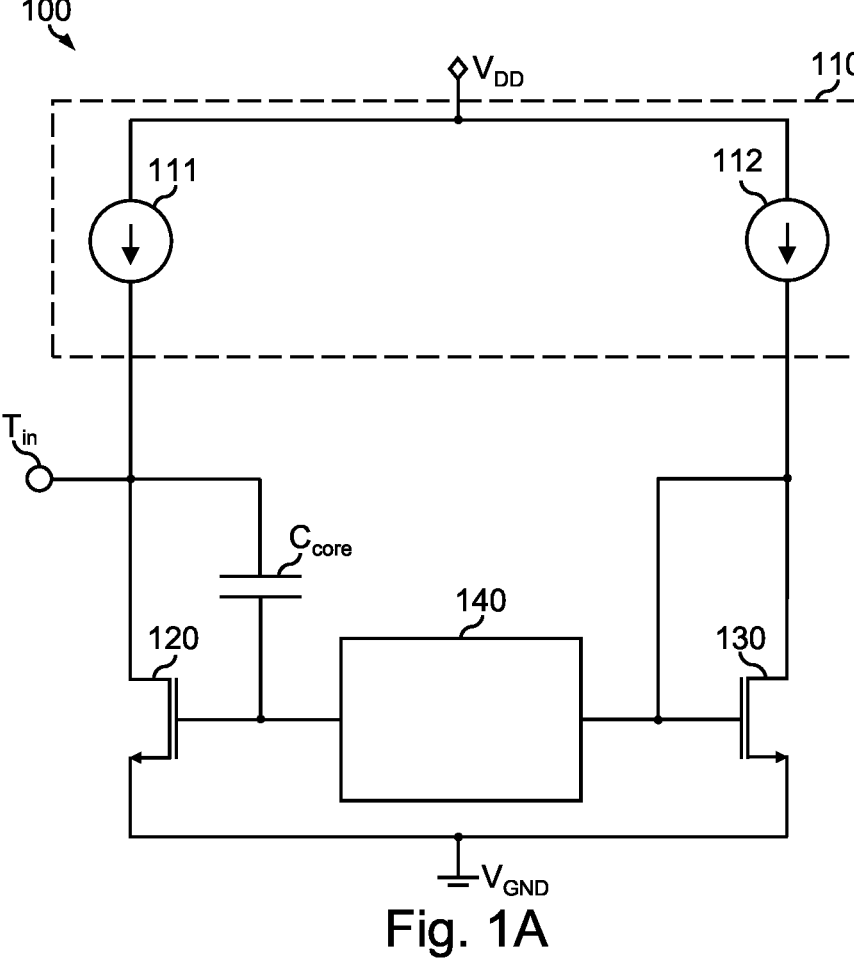
Fig. 1A
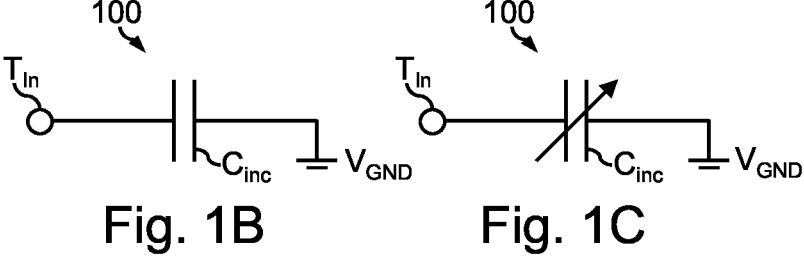
Fig. 1B                    Fig. 1C

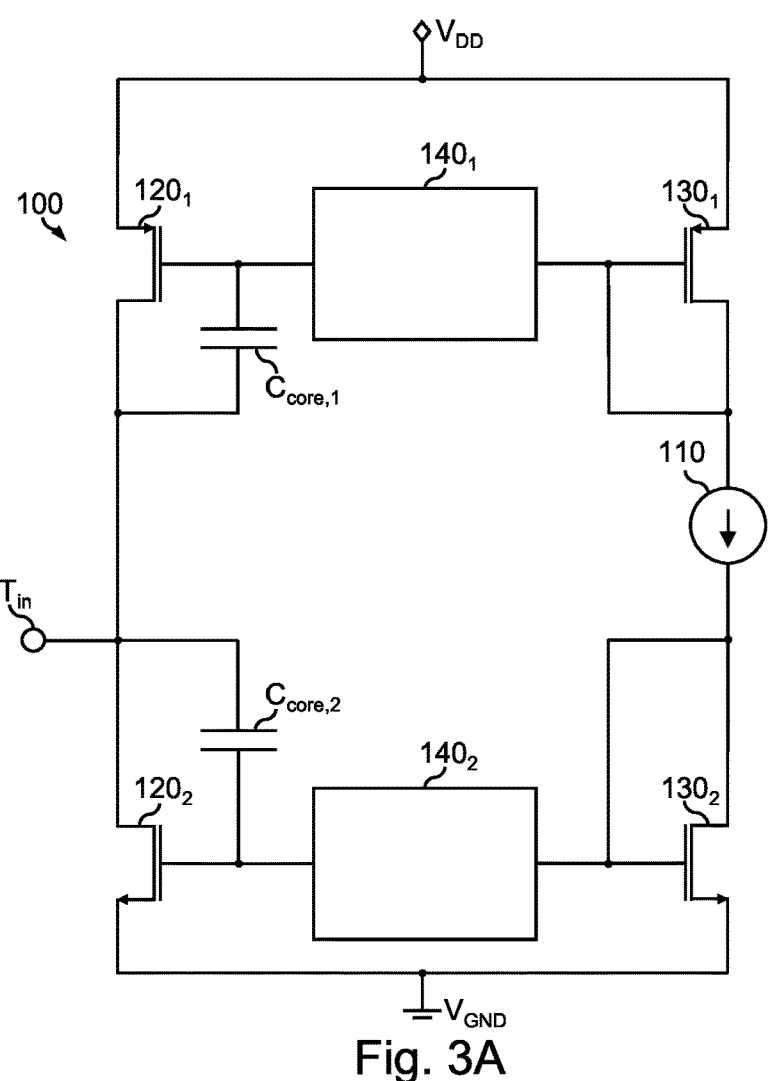
Fig. 3A
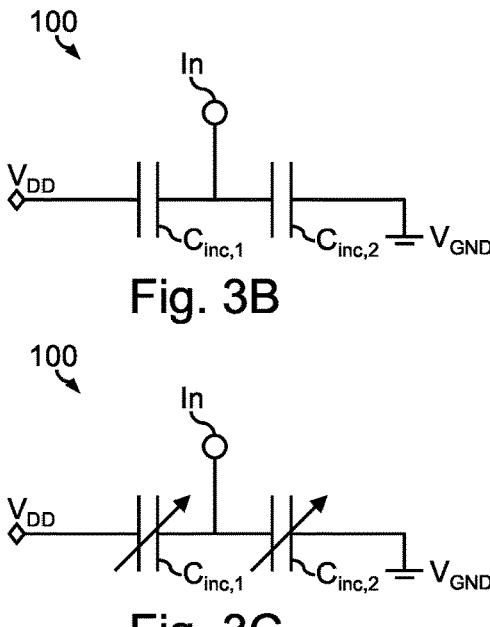
Fig. 3B
Fig. 3C

CAPACITANCE CIRCUIT

This Application claims priority to German Application Number 102023108921.8 filed on Apr. 6, 2023, the entire content of which is incorporated herein by reference.

TECHNICAL FIELD

The invention generally relates to capacitors and more precisely to circuits providing increased capacitance values.

BACKGROUND

Capacitors typically require significant die areas, which may be in particular an issue when implementing integrated filters, such as low pass filters. While approaches exist to provide increased capacitance values while managing the die area of the capacitors, such approaches rely on complex circuitry, higher frequencies, are difficult to adjust to a desired capacitance value and/or do not exhibit direct current (DC) behavior typical of a capacitor.

Therefore, it is an objective of the present disclosure to provide a circuit providing an increased capacitance value, which is easy to be flexibly or fixedly adjusted, depending on the application, and exhibits DC behavior typical for a capacitor while requiring a reduced amount of die area.

SUMMARY OF THE INVENTION

To achieve this objective, the present disclosure provides a capacitance circuit which has an input terminal and is configured to provide an increased capacitance between the input terminal and a first reference voltage. The capacitance circuit comprises a current source structure configured to provide a compensation current at the input terminal, a first transistor having a first control terminal and a first load current and being coupled to the input terminal, a second transistor having a second control terminal, a capacitance amplification circuit configured to provide a capacitance amplification factor and being coupled between the first control terminal and the second control terminal, and a capacitor having a core capacitance and being coupled between the first control terminal and the input terminal, wherein the compensation current corresponds to the first load current during direct current operation, and wherein the increased capacitance is based on the core capacitance and the capacitance amplification factor.

BRIEF DESCRIPTION OF THE DRAWINGS

Examples of the present disclosure will be described with reference to the following appended drawings, in which like reference signs refer to like elements.

FIGS. 1A to 1C illustrate an example of a capacitance circuit and of an increased capacitance between an input terminal and a ground voltage according to examples of the present disclosure.

FIG. 3A to 3C illustrate an example of the capacitance circuit and of a first increased capacitance between the supply voltage and the input terminal and of a second increased capacitance between the input terminal and the ground voltage according to examples of the present disclosure.

Figure 2A:
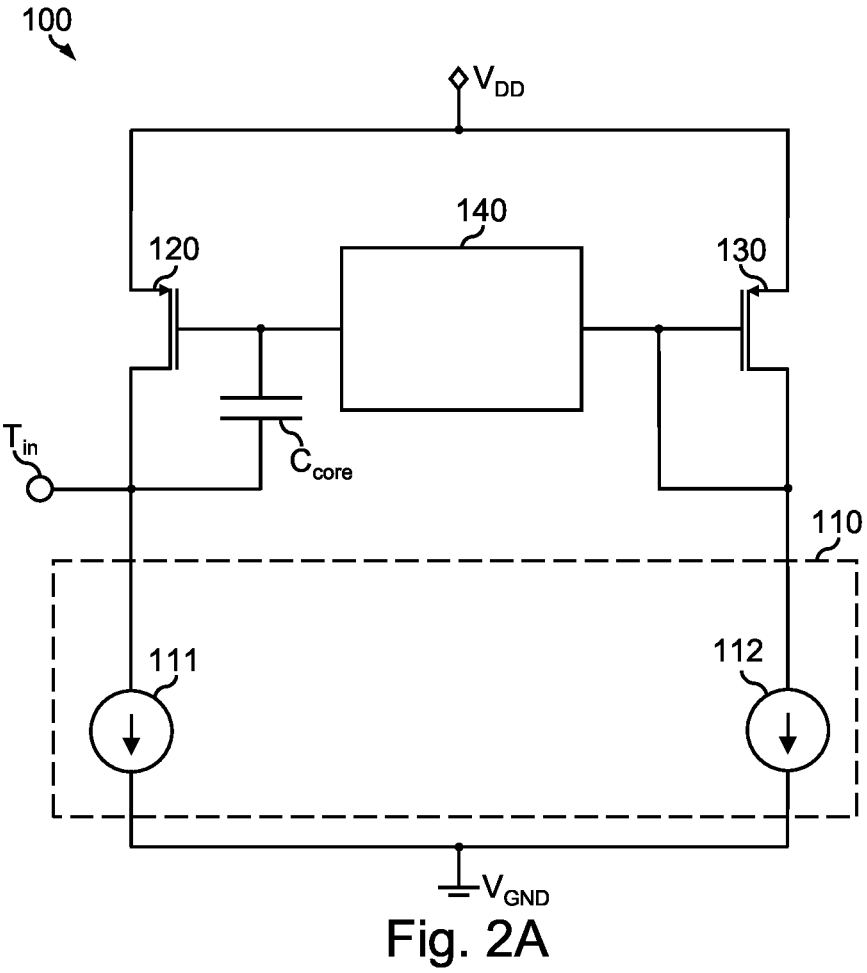
FIGS. 2A to 2C illustrate an example of the capacitance circuit and of the increased capacitance between a supply voltage and the input terminal according to examples of the present disclosure.

It should be understood that the above-identified drawings are in no way meant to limit the present disclosure. Rather, these drawings are provided to assist in understanding the present disclosure. The person skilled in the art will readily understand that aspects of the present invention shown in one drawing may be combined with aspects in another drawing or may be omitted without departing from the scope of the present disclosure.

DETAILED DESCRIPTION

The present disclosure generally provides a capacitance circuit, which comprises a capacitor with a core capacitance. Based on the core capacitance, the capacitance circuit is configured to provide an increased capacitance between an input terminal of the capacitance circuit and a reference voltage, which may e.g. be a ground voltage or a supply voltage. To provide the increased capacitance, the capacitance circuit further includes a capacitance amplification circuit, which provides a capacitance amplification factor. The capacitance amplification factor enables the capacitance circuit to provide the increased capacitance based on the core capacitance and the capacitance amplification factor. Finally, to enable DC behavior similar to a capacitor, i.e. that the current at the input terminal of the capacitance circuit is approximately 0 A during DC operation, the capacitance circuit further comprises a current source structure. The current source structure is configured to provide a compensation current, which causes a current at the input terminal to be approximately 0 A during DC operation of the capacitance circuit.

This general concept will be explained with reference to the appended drawings, with FIGS. 1A to 3C illustrating the capacitance circuit coupled to various reference voltages and FIGS. 4 to 7 illustrating various examples of the capacitance amplification circuit according to the present disclosure. Finally, FIG. 8 illustrates an example of an RC filter employing the capacitance circuit.

FIG. 1A illustrates a capacitance circuit 100. Capacitance circuit 100 has an input terminal $T_{in}$ and is configured to provide an increased capacitance $C_{inc}$ between input terminal $T_{in}$ and a ground voltage $V_{GND}$, as generally illustrated in FIG. 1B. To this end, capacitance circuit 100 comprises a current source structure 110, a first transistor 120, a second transistor 130, a capacitance amplification circuit 140 and a capacitor $C_{core}$.

Current source structure 110 is coupled to input terminal $T_{in}$ and is configured to provide a compensation current at input terminal $T_{in}$. The compensation current causes the current at input terminal $T_{in}$ to be approximately 0 A during DC operation of capacitance circuit. Since in the example of FIG. 1A input terminal $T_{in}$ is coupled to an internal node to which current source 110, first transistor 120, and capacitor $C_{core}$ are coupled, Kirchhoff's current law for the internal node can generally be expressed as shown in equation (1):

$$I_{T_{in}} + I_{comp} - I_{L,120} - I_{C_{core}} = 0 \qquad (1)$$

In equation (1), $I_{T_{in}}$ denotes the current at the input terminal, $I_{comp}$ denotes the compensation current, $I_{L,120}$ denotes the first load current of first transistor 120 and $I_{C_{core}}$ denotes the current through capacitor $C_{core}$. The current $I_{T_{in}}$ during DC operation is to be zero as is the case for a regular capacitor. Likewise, the current $I_{C_{core}}$ is 0 A during DC operation. Thus, for DC operation, equation (1) can be simplified and rearranged as shown in equation (2):

$$I_{comp} = I_{L,120} \qquad (2)$$

In other words, in order to enable standard DC behavior of a capacitor, the compensation current corresponds to the first load current, thereby ensuring that the current at terminal $T_{in}$ is approximately 0 A during DC operation. It is to be understood that the current at terminal $T_{in}$ during DC operation may not be exactly 0 A, e.g. due to temperature variations of the compensation current and the first load current. Accordingly, the current at terminal $T_{in}$ during DC operation may be close to but not exactly 0 A.

To provide the above-discussed functionality of current source structure 110, current source structure 110 may be for example implemented by current sources 111 and 112, as illustrated in FIG. 1A. Current sources 111 and 112 may be for example implemented as biased transistors coupled to a biasing structure, as will be discussed with regard to FIG. 8. It will be understood that current source structure 110 being implemented by current sources 111 and 112 is merely shown as an example. Current source structure 110 may be implemented in any other way suitable to provide the compensation current in accordance with the above-discussed principles.

First transistor 120 has a first control terminal and a first load path, which is coupled to input terminal $T_{in}$. When turned on via the first control terminal, the first load current flows through transistor 120. First transistor 120 may be an n-channel metal oxide semiconductor (n-MOSFET), as shown throughout the figures, but may more generally be any type of switch suitable for implementing capacitance circuit 100, such as a p-channel MOSFET or an insulated gate bipolar transistor (IGBT). Similarly, second transistor 130 has a second control terminal and may be implemented as n-MOSFET, as shown throughout the figures, or may be any other type of switch suitable for implementing capacitance circuit 100, such as a p-MOSFET or an IGBT. First transistor 120 and second transistor 130 together form a current mirror.

Capacitance amplification circuit 140 is configured to provide a capacitance amplification factor and is coupled between the first control terminal and the second control terminal. The capacitance amplification factor corresponds to the internal resistance of capacitance amplification circuit 140 and may consequently also be referred to as the internal resistance $R_{140}$ of capacitance amplification circuit 140. Based on the arrangement of capacitance amplification circuit 140 between the first control terminal and the second control terminal, the capacitance amplification factor provided by capacitance amplification circuit 140 is used by capacitance circuit 100 to provide the increased capacitance, as will be discussed in the following.

Capacitor $C_{core}$ has a core capacitance and is coupled between the first control terminal and input terminal $T_{in}$. In other words, capacitor $C_{core}$ is arranged with regard to first transistor 120 so that first transistor 120 is configured to serve as a gain structure for capacitor $C_{core}$. Based on this arrangement, first gain $g_{120}$ can be used by capacitance circuit 100 to provide the increased capacitance.

Considering only AC components of the currents in equation (1), equation (1) can be simplified as shown in equation (3):

$$I_{T_{in}} = I_{L,120} + I_{C_{core}} \qquad (3)$$

Since the compensation current provided by current source structure 110 is only a direct current, i.e. $I_{comp,AC}$ is 0 A, $I_{comp}$ is omitted in equation (3). Further, due to first transistor 120 serving as a gain structure for capacitor $C_{core}$ and due to the current mirror formed by first transistor 120 and second transistor 130, $I_{L,120}$ can be expressed as shown in equation (4):

$$I_{L,120} = \left( \frac{g_{120}}{g_{130}} + g_{120} * R_{140} \right) I_{C_{core}} \qquad (4)$$

In equation (4), $g_{120}$ and $g_{130}$ respectively refer to the gain of first transistor 120 and of second transistor 130. Substituting $I_{L,120}$ in equation (3) with the expression of $I_{L,120}$ according to equation (4) results in equation (5):

$$I_{T_{in}} = \left( \frac{g_{120}}{g_{130}} + g_{120} * R_{140} + 1 \right) I_{C_{core}} \qquad (5)$$

Based on equation (5), the increased capacitance can be expressed based on the capacitance of capacitor $C_{core}$ as shown in equation (6):

$$C_{inc} = \left( \frac{g_{120}}{g_{130}} + g_{120} * R_{140} + 1 \right) I_{C_{core}} \qquad (6)$$

It will be noted that $C_{core}$ may refer to both the capacitor of capacitance circuit 100 itself as well as to the core capacitance of the capacitor of capacitance circuit 100, as e.g. shown in equation (6).

Based on equation (6), it can be seen that the increased capacitance provided by capacitance circuit 100 can be determined based on the gains of first transistor 120 and second transistor 130 as well as based on the capacitance amplification factor, i.e. internal resistance $R_{140}$. As will be discussed in the following, capacitance amplification circuit 140 enables provision of both a fixed and a variable increased capacitance without affecting the DC operation of capacitance circuit 100 as well as the power consumption of capacitance circuit 100.

Figure 4:
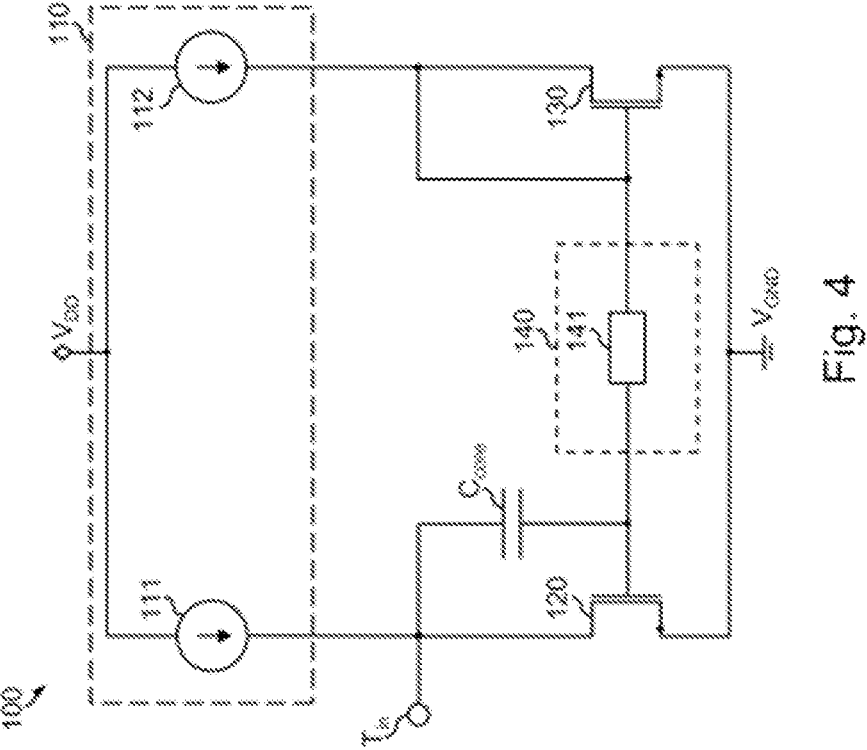
FIG. 4 illustrates the capacitance circuit with an exemplary capacitance amplification circuit according to examples of the present disclosure.

As illustrated in FIG. 4, capacitance amplification circuit 140 may comprise a capacitance amplification resistor 141. Capacitance amplification resistor 141 has a resistance and consequently the capacitance amplification factor may correspond to the resistance of capacitance amplification resistor 141. In the example of capacitance amplification circuit 140 of FIG. 4, capacitance amplification circuit 140 provides a fixed increased capacitance in accordance with equation (6) above. If the example of capacitance amplification circuit 140 is employed in capacitance circuit 100, capacitance circuit 100 of FIG. 1A may also be illustrated as shown in FIG. 1B.

Figure 5:
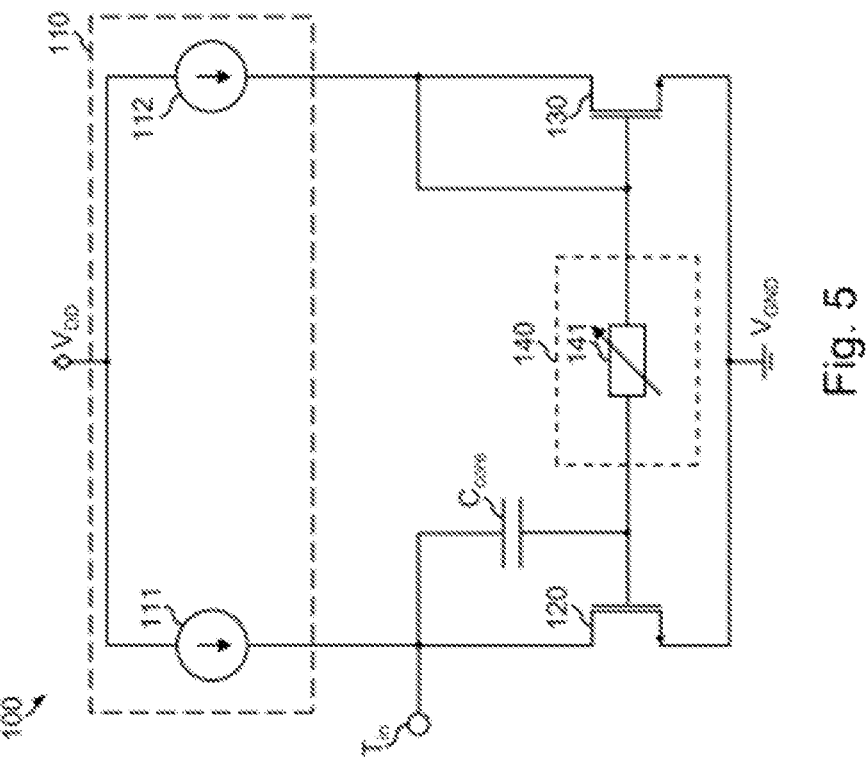
FIG. 5 illustrates the capacitance circuit with an exemplary capacitance amplification circuit according to examples of the present disclosure.
Figure 6:
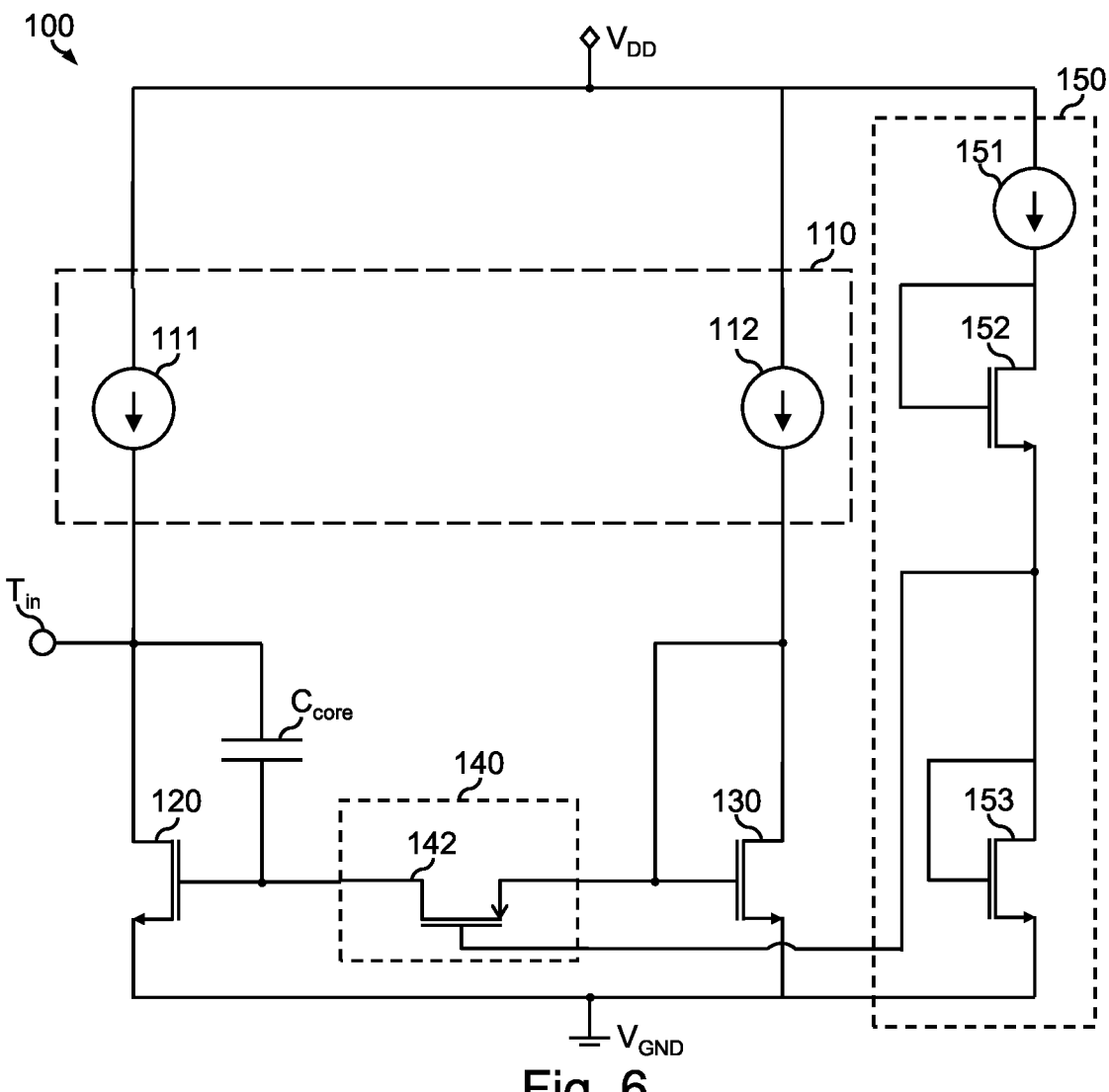
FIG. 6 illustrates the capacitance circuit with an exemplary capacitance amplification circuit according to examples of the present disclosure.
Figure 7:
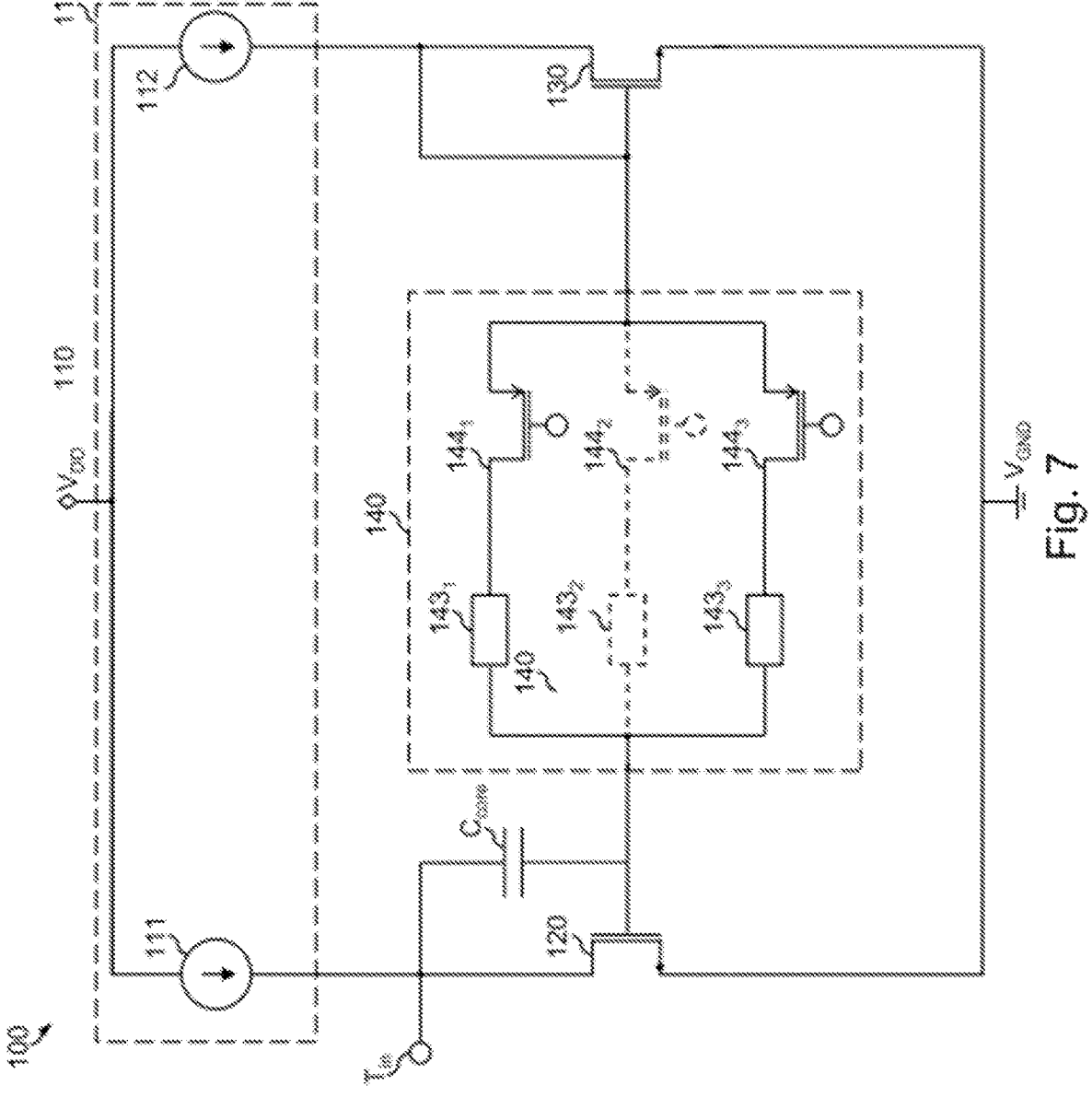
FIG. 7 illustrates the capacitance circuit with an exemplary capacitance amplification circuit according to examples of the present disclosure.
Figure 8:
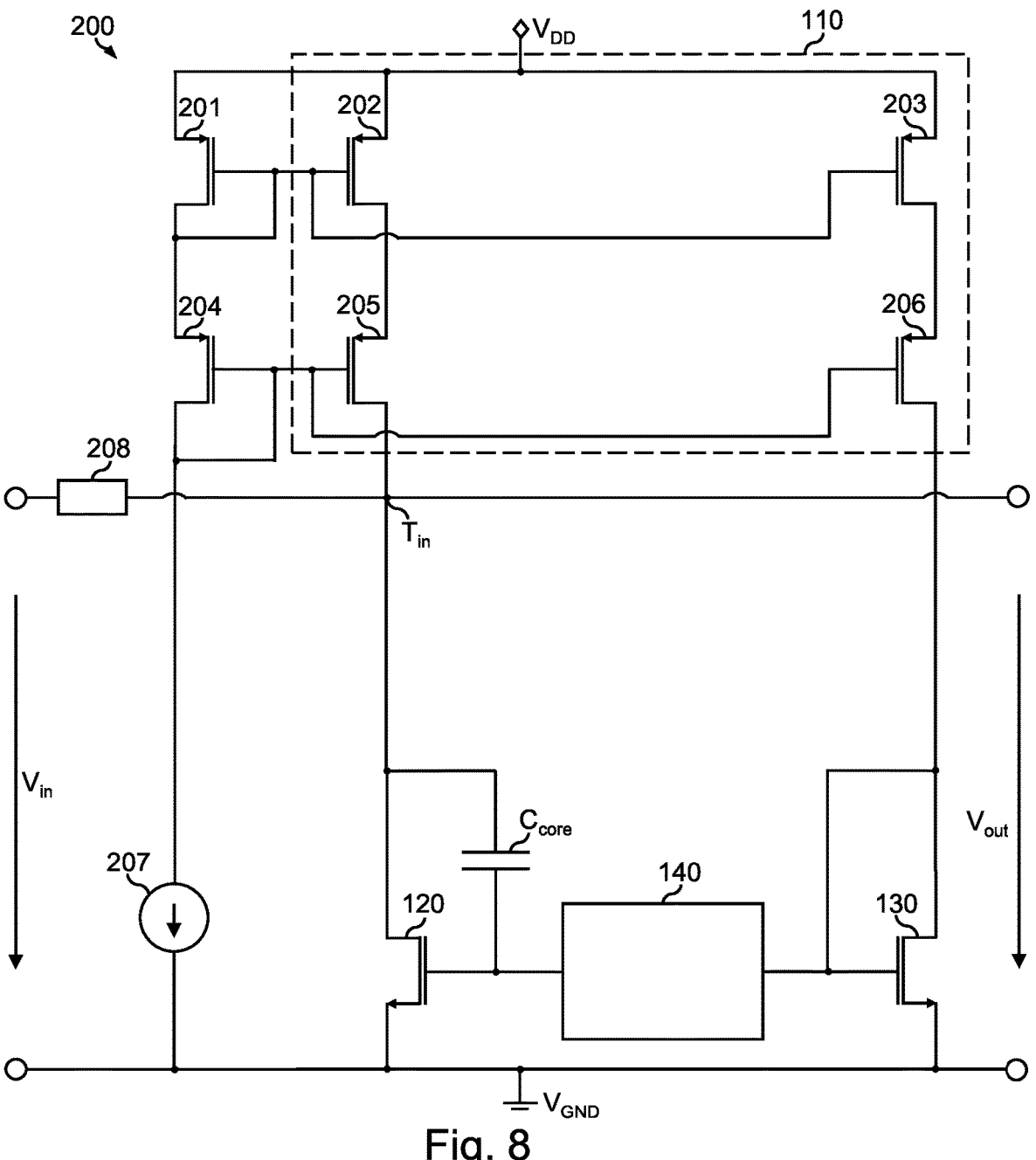
FIG. 8 illustrates an RC filter circuit including the capacitance circuit according to examples of the present disclosure.

As illustrated in FIGS. 5 to 7, the capacitance amplification factor may be a variable capacitance amplification factor and accordingly capacitance amplification circuit 140 may be configured to provide the variable capacitance amplification factor. Thus, If the example of capacitance amplification circuit 140 of any one of FIGS. 5 to 7 is employed in capacitance circuit 100, capacitance circuit 100 of FIG. 1A may also be illustrated as shown in FIG. 1C.

As illustrated in FIG. 5, capacitance amplification resistor 141 may be a variable capacitance amplification resistor which provides a variable resistance. In such an example of capacitance amplification circuit 140, the variable capacitance amplification factor may correspond to the variable resistance.

As illustrated in FIG. 6, capacitance amplification circuit 140 may comprise a capacitance amplification transistor 142. Capacitance amplification transistor 142 has a capacitance amplification control terminal and a load path, which has a load path resistance. The load path resistance may depend on a capacitance amplification control voltage applied at the capacitance amplification control terminal. Accordingly, in the example of capacitance amplification circuit 140 of FIG. 6, the variable capacitance amplification factor may correspond to the load path resistance. To enable control of the load path resistance via the capacitance amplification control terminal, capacitance circuit 100 may further comprise a capacitance amplification control circuit 150 coupled to the capacitance amplification control terminal. Capacitance amplification control circuit 150 may be configured to provide the capacitance amplification control voltage. To this end, capacitance amplification control circuit 150 may comprise a control current source 151, a first control transistor 151 and a second control transistor 152. The capacitance amplification control voltage may for example be varied by varying the current provided by control current source 151. If control current source 151 is implemented as a fixed current source, capacitance circuit 100 of FIG. 6 may also serve as an example of a capacitance circuit providing a fixed increased capacitance.

As illustrated in FIG. 7. Capacitance amplification circuit 140 may comprise a plurality of capacitance amplification branches arranged in parallel. Each capacitance amplification branch may comprise a capacitance amplification branch resistor, such as capacitance amplification branch resistors 143_1, 143_2 and 143_3, and a capacitance amplification branch transistor, such as amplification branch transistors 144_1, 144_2 and 144_3, which may be coupled in series. Capacitance amplification branch transistors 143_1, 143_2 and 143_3 may be configured to couple the corresponding capacitance amplification circuit branch between the first control terminal and the second control terminal. The variable capacitance amplification factor provided by capacitance amplification circuit 140 of FIG. 7 corresponds to a combined resistance of capacitance amplification circuit branches coupled in parallel by the corresponding capacitance amplification branch transistors. In other words, the variable capacitance amplification factor, i.e. the internal resistance of capacitance amplification circuit 140, may be varied by variably coupling capacitance amplification branch resistors 143_1, 143_2 and 143_3 in parallel based on controlling the capacitance amplification branch transistors 144_1, 144_2 and 144_3 in order to achieve the intended increased capacitance.

It will be understood that capacitance amplification circuit 140 of FIG. 7 may include any number of capacitance amplification branches depending on the actual implementation of capacitance amplification circuit 140, as indicated by the middle capacitance amplification branch being shown with dashed lines. Accordingly, it will be understood that capacitance amplification circuit 140 may include more or less capacitance amplification branches than shown in FIG. 7.

It will be understood that FIGS. 4 to 7 provide examples of implementations of the general concept of capacitance amplification circuit 140 discussed above with regard to FIG. 1A. Capacitance amplification circuit 140 may be implemented in other ways in accordance with the general concept of capacitance amplification circuit 140, i.e. the provision of a fixed or variable capacitance amplification factor between the first control terminal and the second control terminal.

Since capacitance amplification circuit 140 does not impact the equivalent series resistance (ESR) of capacitance circuit 100, capacitance amplification circuit 140 does not impact the power consumption of capacitance circuit 100. More precisely, the ESR only depends on the gain of first transistor 120 since first transistor 120 is the only element located in the path between input terminal $T_{in}$ and the first reference voltage, which in the case is ground voltage $V_{GND}$. The ESR of capacitance circuit 100 may thus be calculated as shown in equation (7):

$$ESR = \frac{1}{g_{120}} \tag{7}$$

Figures 2B, 2C:
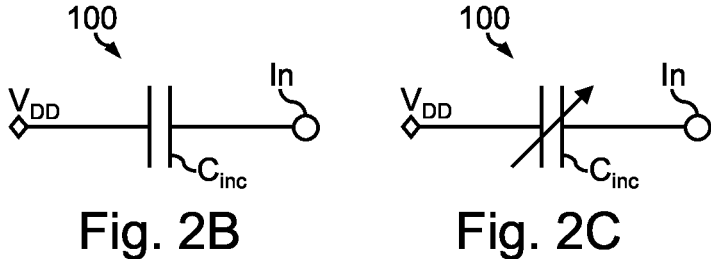

FIGS. 1A to 1C illustrate capacitance circuit 100 as providing the increased capacitance between input terminal $T_{in}$ and ground voltage $V_{GND}$. Since the first reference voltage may also be supply voltage $V_{DD}$, capacitance circuit 100 may also provide the increased capacitance between input terminal $T_{in}$ and supply voltage $V_{DD}$. An example of capacitance circuit 100 providing the increased capacitance between input terminal $T_{in}$ and supply voltage $V_{DD}$ is shown in FIGS. 2A to 2C. FIG. 2A shows the detailed arrangement of the elements of capacitance circuit 100 as discussed with regard to FIG. 1A arranged to provide the increased capacitance between input terminal $T_{in}$ and supply voltage $V_{DD}$ while FIG. 2B illustrates the fixed increased capacitance between input terminal $T_{in}$ and supply voltage $V_{DD}$ and FIG. 2C illustrates the variable increased capacitance between input terminal $T_{in}$ and supply voltage $V_{DD}$.

Capacitance circuit 100 may also provide two increased capacitances, one between input terminal $T_{in}$ and ground voltage $V_{GND}$ and one between input terminal $T_{in}$ and supply voltage $V_{DD}$. This concept is illustrated in FIGS. 3A to 3C. In the example of capacitance circuit 100 of FIG. 3A the arrangement of first transistor 120, second transistor 130, capacitor $C_{core}$ and capacitance amplification circuit 140 is provided twice, once between supply voltage $V_{DD}$ and input terminal $T_{in}$ and once between input terminal $T_{in}$ and ground voltage $V_{GND}$. In this example of capacitance circuit 100, current source structure 100 may comprise one current source which is configured to provide the compensation current. Since first transistors 120_1 and 120_2 and second transistors 130_1 and 130_2 respectively form a current mirror, the compensation current is mirrored into the internal node to which input terminal $T_{in}$ is coupled in order to enable standard DC operation behavior of a capacitor.

FIG. 7 illustrates an RC filter circuit 200 including capacitance circuit 100 of FIG. 1A. In other words, FIG. 7 provides an example deployment of capacitance circuit 100 in order to save die area when implementing an integrated circuit, such as RC filter circuit 200. In the example of FIG. 7, current source structure 110 is implemented with transistors 202, 203, 205 and 206, with transistors 202 and 205 implementing current source 111 of FIG. 1A and transistors 203 and 206 implementing current source 112 of FIG. 1A. Transistors 201 and 204 and current source 207 are configured to determine the value of the compensation current. In other words, transistors 201 and 204 and current source 207 form a biasing structure for the transistors implementing current source 111 and 112. Resistor 208 is coupled to terminal $T_{in}$, which is shown in FIG. 7 as a node of RC filter 200. Resistor 208 and capacitance circuit 100 thus form RC filter 200.

Using a low-pass filter with a cut-off frequency of 100 Hz and a value of 100 kΩ as an example, the capacitor of RC filter circuit 200 would have to have a capacitance of 16 nF. By using capacitance circuit 100 in RC filter circuit 200, a core capacitance of capacitor $C_{core}$ of 20 pF is sufficient to implement RC filter 200 since capacitance circuit 100 is configured to provide an increased capacitance of 16 nF based on the core capacitance of 20 pF. In other words, based on capacitance circuit 100, a capacitor can be used for RC filter circuit 200 which has a capacitance of only 1/800 of the capacitance which would otherwise be required, thereby reducing the die area needed to implement RC filter circuit 200.

The invention may further be illustrated by the following examples.

In an example, a capacitance circuit having an input terminal and configured to provide an increased capacitance between the input terminal and a first reference voltage, comprises a current source structure configured to provide a compensation current at the input terminal; a first transistor having a first control terminal and a first load current and being coupled to the input terminal; a second transistor having a second control terminal; a capacitance amplification circuit configured to provide a capacitance amplification factor and being coupled between the first control terminal and the second control terminal; and a capacitor having a core capacitance and being coupled between the first control terminal and the input terminal, wherein the compensation current corresponds to the first load current during direct current operation, and wherein the increased capacitance is based on the core capacitance and the capacitance amplification factor.

In an example, the capacitance amplification circuit may comprise a capacitance amplification resistor having a resistance, and the capacitance amplification factor may correspond to the resistance.

In an example, the capacitance amplification factor may be a variable capacitance amplification factor, and the capacitance amplification circuit may be configured to provide the variable capacitance amplification factor.

In an example, the capacitance amplification circuit may comprise a variable capacitance amplification resistor having a variable resistance, and the variable capacitance amplification factor may correspond to the variable resistance.

In an example, the capacitance amplification circuit may comprise a capacitance amplification transistor having a capacitance amplification control terminal and a load path having a load path resistance, the load path resistance depending on a capacitance amplification control voltage applied at the capacitance amplification control terminal, and the variable capacitance amplification factor may correspond to the load path resistance.

In an example, the capacitance circuit may further comprise a capacitance amplification control circuit coupled to the capacitance amplification control terminal and configured to provide the capacitance amplification control voltage.

In an example, the capacitance amplification circuit may comprise a plurality of capacitance amplification branches arranged in parallel, wherein each capacitance amplification branch may comprise a capacitance amplification branch resistor and a capacitance amplification branch transistor coupled in series, and each capacitance amplification branch transistor may be configured to couple the corresponding capacitance amplification circuit branch between the first control terminal and the second control terminal; and the variable capacitance amplification factor may correspond to a combined resistance of capacitance amplification circuit branches coupled in parallel by the corresponding capacitance amplification branch transistors.

In an example, the first transistor may have a first gain, and the increased capacitance may be further based on the first gain.

In an example, the second transistor may have a first gain, and the equivalent series resistance of the capacitance circuit may correspond to an inverse of the first gain.

In an example, the first reference voltage may be at least one of a ground reference voltage and a supply reference voltage.

The preceding description has been provided to illustrate a capacitance circuit. It should be understood that the description is in no way meant to limit the scope of the present disclosure to the precise embodiments discussed throughout the description. Rather, the person skilled in the art will be aware that the examples of the present disclosure may be combined, modified or condensed without departing from the scope of the present disclosure as defined by the following claims.

The invention claimed is:

1. A capacitance circuit including an input terminal and configured to provide an increased capacitance between the input terminal and a first reference voltage, the capacitance circuit comprising:

a current source structure configured to provide a compensation current at the input terminal;

a first transistor including a first control terminal and configured to provide a first load current, wherein the first transistor is coupled to the input terminal;

a second transistor including a second control terminal;

a capacitance amplification circuit configured to provide a capacitance amplification factor, wherein the capacitance amplification circuit is coupled between the first control terminal and the second control terminal; and a capacitor that defines a core capacitance and being coupled between the first control terminal and the input terminal, wherein the compensation current corresponds to the first load current during direct current operation, wherein the increased capacitance is based on the core capacitance and the capacitance amplification factor, wherein:

the capacitance amplification factor is a variable capacitance amplification factor, and the capacitance amplification circuit is configured to provide the variable capacitance amplification factor, wherein:

the capacitance amplification circuit comprises a plurality of capacitance amplification branches arranged in parallel, wherein:

each of the capacitance amplification branches comprises a capacitance amplification branch resistor and a capacitance amplification branch transistor coupled in series, and each capacitance amplification branch transistor is configured to couple a corresponding capacitance amplification circuit branch between the first control terminal and the second control terminal, and wherein the variable capacitance amplification factor corresponds to a combined resistance of capacitance amplification circuit branches coupled in parallel by corresponding capacitance amplification branch transistors.

2. The capacitance circuit of claim 1, wherein:

a respective capacitance amplification branch resistor defines a resistance, and respective capacitance amplification factor associated with the respective capacitance branch amplification resistor corresponds to the resistance.

3. The capacitance circuit of claim 1, wherein:

the capacitance amplification circuit comprises a variable capacitance amplification resistor that defines a variable resistance, and the variable capacitance amplification factor corresponds to the variable resistance.

4. The capacitance circuit of claim 1, wherein:

a respective capacitance amplification branch transistor includes a capacitance amplification control terminal and the capacitance amplification circuit is configured to define a load path having a load path resistance, the load path resistance depending on a capacitance amplification control voltage applied at the capacitance amplification control terminal, and wherein the variable capacitance amplification factor corresponds to the load path resistance.

5. The capacitance circuit of claim 4, further comprising a capacitance amplification control circuit coupled to the capacitance amplification control terminal and configured to provide the capacitance amplification control voltage.

6. The capacitance circuit of claim 1, wherein:

the first transistor has a first gain, and the increased capacitance is further based on the first gain.

7. The capacitance circuit of claim 1, wherein:

the first transistor has a first gain, and an equivalent series resistance of the capacitance circuit corresponds to an inverse of the first gain.

8. The capacitance circuit of claim 1, wherein the first reference voltage is at least one of a ground reference voltage and a supply reference voltage.

* * * * *